United States Patent
Golz et al.

(10) Patent No.: US 6,703,312 B2
(45) Date of Patent: Mar. 9, 2004

(54) METHOD OF FORMING ACTIVE DEVICES OF DIFFERENT GATELENGTHS USING LITHOGRAPHIC PRINTED GATE IMAGES OF SAME LENGTH

(75) Inventors: John Walter Golz, Cold Spring, NY (US); Babar Khan, Ossining, NY (US); Joyce C. Liu, Carmel, NY (US); Christopher Joseph Waskiewicz, Poughkeepsie, NY (US); Teresa Jacqueline Wu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/151,074

(22) Filed: May 17, 2002

(65) Prior Publication Data

US 2003/0216050 A1 Nov. 20, 2003

(51) Int. Cl.⁷ .............................................. H01L 21/301
(52) U.S. Cl. ........................ 438/696; 438/720; 438/724
(58) Field of Search ................................. 438/585, 696, 438/706, 717, 720, 723, 724

(56) References Cited

U.S. PATENT DOCUMENTS

| | | | | | |
|---|---|---|---|---|---|
| 4,963,501 | A | * | 10/1990 | Ryan et al. | 438/183 |
| 6,063,688 | A | * | 5/2000 | Doyle et al. | 438/424 |
| 6,407,420 | B1 | * | 6/2002 | Yamanaka et al. | 257/296 |
| 6,586,303 | B2 | * | 7/2003 | Wu | 438/262 |

* cited by examiner

Primary Examiner—Kin-Chan Chen
(74) Attorney, Agent, or Firm—Ira D. Blecker

(57) ABSTRACT

As disclosed herein, a method is provided for simultaneously patterning features having a first width in a first portion such as a logic portion of an integrated circuit, and having a second width in a second portion such as an array portion of an integrated circuit. The method includes depositing a feature layer over a substrate and a hardmask material layer thereover. Photoresist patterns are then formed in the first and second portions with a critical dimension mask, and are then used to etch the hardmask material layer into hardmask patterns. Sidewall spacers are provided on sidewalls of the hardmask patterns in the second portion. Then, the feature layer is simultaneously etched in both first and second portions, using the hardmask patterns in the first portion to define features having a first width, and using the hardmask patterns and the sidewall spacers in the second portion to define features having a second width.

20 Claims, 3 Drawing Sheets

METHOD OF FORMING ACTIVE DEVICES OF DIFFERENT GATELENGTHS USING LITHOGRAPHIC PRINTED GATE IMAGES OF SAME LENGTH

FIELD OF THE INVENTION

The present invention relates to photolithographic patterning of a semiconductor substrate and more specifically to a method for of manufacturing logic and DRAM critical gatelengths using lithographic critical dimension imaging.

BACKGROUND OF THE INVENTION

Logic based embedded dynamic random access memories (hereinafter DRAMs) requires that the DRAM be embedded in a logic chip without adversely affecting the performance of logic devices thereon. This is a necessity for offering logic library design platforms which include embedded DRAM macros. As the scale of integration increases, device feature sizes are reduced, requiring devices to be fabricated with ever smaller gatelengths, such that some gatelengths required for logic today can no longer be achieved by photolithography alone.

When very small gatelengths are desired (less than 0.1 um), one current method of attaining the reduced size is to print a larger photoresist pattern and then to trim the feature during the mask open process. Doing so requires that pattern size on the reticle be larger by at the least the trim amount (for example by 0.05 um), e.g. a reticle pattern size of 0.14 um for printing a 0.14 um resist pattern which is then trimmed during a mask open process to 0.09 um.

However, the printing of larger features and trimming by mask open cannot be done for very closely spaced line patterns of the DRAM array (e.g. gate conductors (GC) in a planar device DRAM; or polysilicon wordlines in a DRAM array having vertical devices (both of which are hereinafter referred to as gate conductors (GCs)). The problem results from GC pitch limitations in the DRAM array. To illustrate, in a DRAM array which requires a GC pitch of 0.29 um, GC linewidth may be set to 0.15 um, while the space between GCs may be set to 0.14 um. If GCs of the DRAM array were patterned by the same process of printing large features and trimming them, as used for logic gates, the desired GC pitch could not be achieved. To further illustrate, when the required GC linewidth is 0.15 um and the required GC spacing is 0.14 um, the required printed feature sizes before trimming would be GC linewidth of 0.20 um and GC spacing of 0.09. However, such line/space photoresist patterns cannot be printed using available photolithography because the linewidth/space ratio is too high for the feature size. The problem here, therefore, becomes not so much the printing of the photoresist but rather the ability to print the required line/space patterns in both the logic and DRAM array of the chip, simultaneously. One can imagine that this problem can only become worse in future generation technologies when feature sizes are reduced even further.

Another problem is achieving desired gatelengths simultaneously, while maintaining processing tolerances for the different field effect transistor types of both logic and DRAM. Logic chips must meet aggressive requirements for across chip line width variation (hereinafter ACLV), as dictated by the technology generation. The lithography process window to fulfill logic ACLV requirements is extremely small. For logic-based embedded DRAM chip fabrication, the DRAM FET gatelength requirements add another degree of critical dimension control, which results in minimum to nonexistent lithographic process windows. In order to make both the logic FET and DRAM FET gatelengths on target, the solutions often require many iterations of design data changes and mask rebuilds, which affect the overall cost and timeliness of development cycles. A new solution is needed to achieve desired gatelengths in both the logic FET and DRAM FET of logic chips with embedded DRAM.

SUMMARY OF THE INVENTION

Accordingly, in the present invention a method is provided for simultaneously patterning features having a first width in a first portion such as a logic portion of an integrated circuit, and having a second width in a second portion such as an array portion of an integrated circuit. The method includes depositing a feature layer over a substrate and a hardmask material layer thereover. Then, a photoresist layer thereover is patterned using a critical dimension mask to define photoresist patterns in the first and second portions, which are then used to pattern the hardmask material layer into hardmask patterns. Sidewall spacers are provided on sidewalls of the hardmask patterns in the second portion. The feature layer is then simultaneously etched in both first and second portions, using the hardmask patterns in the first portion to define features having a first width, and using the hardmask patterns and the sidewall spacers in the second portion to define features having a second width.

In a preferred embodiment of the invention, a method is provided for defining GC and polysilicon line features of different gatelengths in the respective logic and embedded DRAM portions of a combined logic and embedded DRAM chip, without requiring such features of the logic portion and the DRAM array portion to be patterned by separate critical dimension masks. In an embodiment described herein, very small gatelength features are formed by this method in the logic portion, while longer gatelength features are formed in the array portion of the chip at the same time.

In a preferred embodiment of the invention, a layer of gate conductor material such as polysilicon is deposited on a semiconductor substrate, after which a layer of oxide is deposited thereover. Then, using a single critical dimension mask, a photoresist is applied and patterned having the same linewidths in both logic and array portions of the substrate. Next, a mask open process is performed to etch and trim the underlying oxide layer with the resist pattern in both logic and array portions of the substrate, resulting in oxide patterns. Spacers are then formed on sidewalls of the oxide patterns. Then, a block mask is used to protect the array portion of the substrate while the sidewall spacers are removed from the logic portion. Preferably, an additional hardmask is deposited over the oxide/spacer patterns to further protect spacers in the array portion while spacers are removed from the logic portion via, for example, a selective wet etch technique. The underlying gate conductor material is then etched, using the oxide patterns in the logic portion of the substrate as a hardmask, and using the combined oxide/spacer patterns in the array portion as a hardmask. In this manner, gate conductors having different gatelengths are simultaneously defined in respective logic and array portions of the substrate using only one critical dimension mask. Further gate conductor processing then proceeds in any of several ways as is well known to those skilled in the art.

DETAILED DESCRIPTION OF THE PREFERRED EMBODIMENTS

Figure 1:
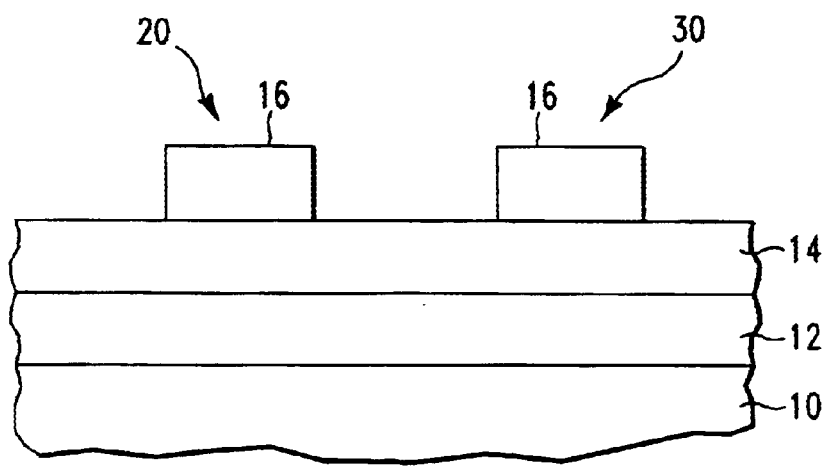
FIGS. 1 to 7 illustrate steps, including alternatives, in performing a preferred embodiment of the present invention.

FIG. 1 illustrates an initial step in the processing method of the present invention. The following description of the invention is made with reference to a semiconductor substrate preferably of silicon, or having a device layer of silicon such as in a silicon-on-insulator (SOI) substrate. However, it will be understood that the principles of the invention are not limited to the processing of silicon and SOI substrates and that they are applied in the appropriate context to the processing of other types of semiconductor substrates, e.g. germanium, III-V compounds and silicon-containing substrates, e.g. SiGe, SiC.

As shown in FIG. 1, a layer of polysilicon 12 is formed as a gate conductor material layer over a semiconductor substrate 10 of silicon or SOI, for example. While not specifically shown in the Figures, the presence of a gate dielectric layer between the semiconductor substrate 10 and the polysilicon layer 12 is presumed, where transistor gates are to be formed. Next, an oxide layer 14 is formed over the polysilicon layer 12, for example, by deposition from a TEOS (tetra-ethyl orthosilicate) precursor. A photoresist is then applied and patterned with a critical dimension mask, resulting in resist patterns 16 in both a logic portion 20 and an array portion 30 of the substrate.

Figure 2:
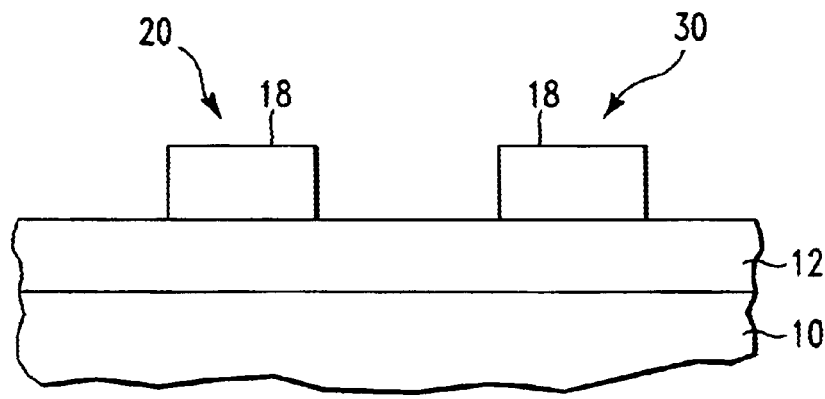
Figure 3:
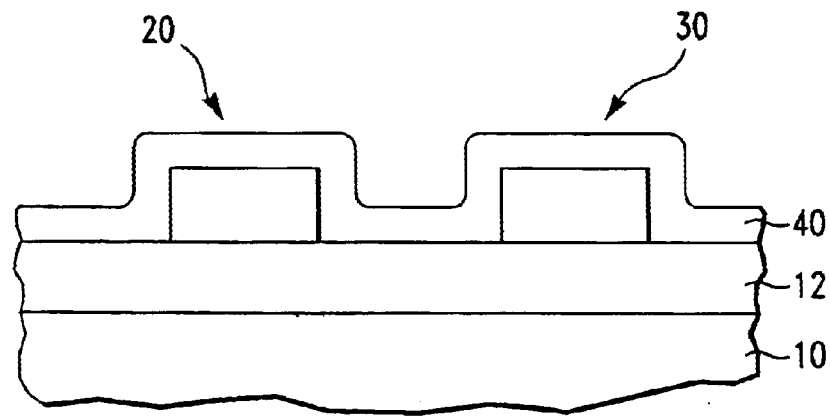
Figure 4:
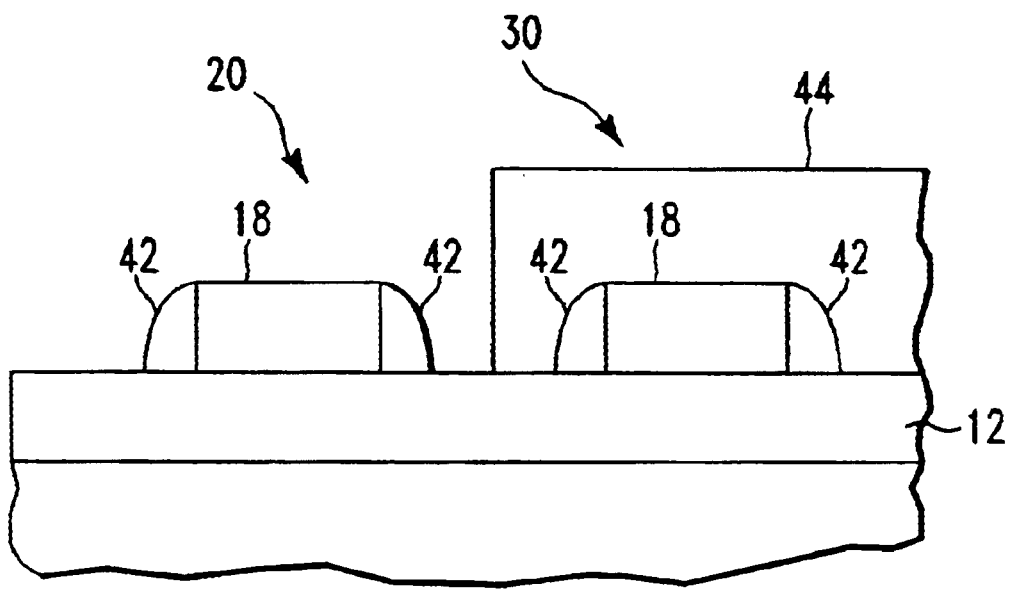

Next, as illustrated in FIG. 2, the oxide layer 14 is then etched, and a mask open process is preferably performed to trim the dimensions of the resulting oxide patterns 18 in both the logic portion 20 and array portion 30 of the substrate. Next, as shown in FIG. 3, a conformal layer 40 of material such as silicon nitride is deposited, and then anistropically etched, for example, by reactive ion etching (RIE), to form spacers 42 on sidewalls of the oxide patterns 18 (FIG. 4). The array portion 30 of the substrate is then masked, for example, by depositing and patterning a block mask 44, e.g of mid-UV photoresist, with a non-critical dimension mask.

Figure 5:
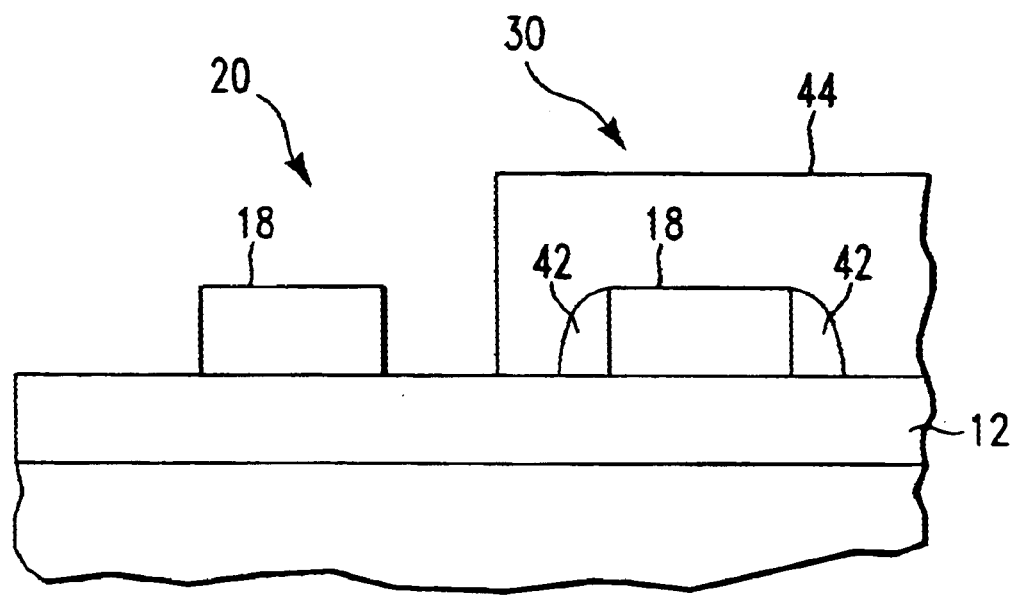

Next, as shown in FIG. 5, sidewall spacers 42 are removed from the logic portion 20. This step is preferably performed via any of several well-known processes for wet etching the spacer material, selective to silicon and oxide materials. Alternatively, an isotropic dry etch process may be used instead to remove sidewall spacers 42 from the logic portion 20. The block mask 44 is then removed, by a known resist strip process.

Figure 6A:
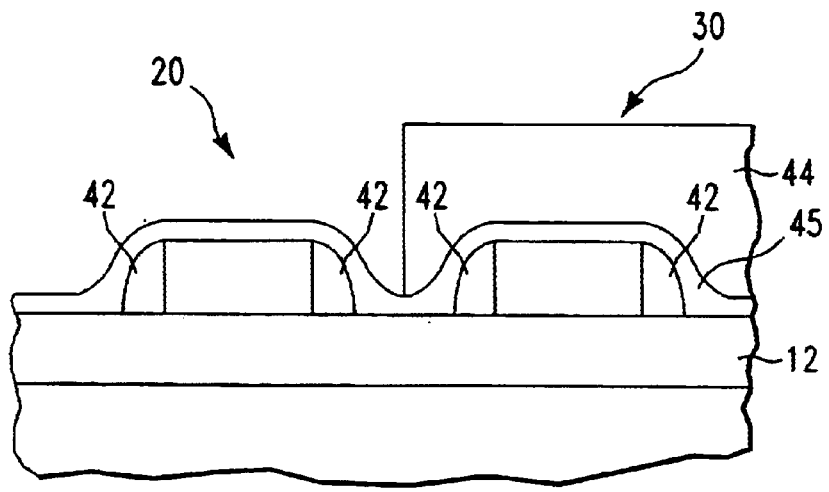
Figure 6B:
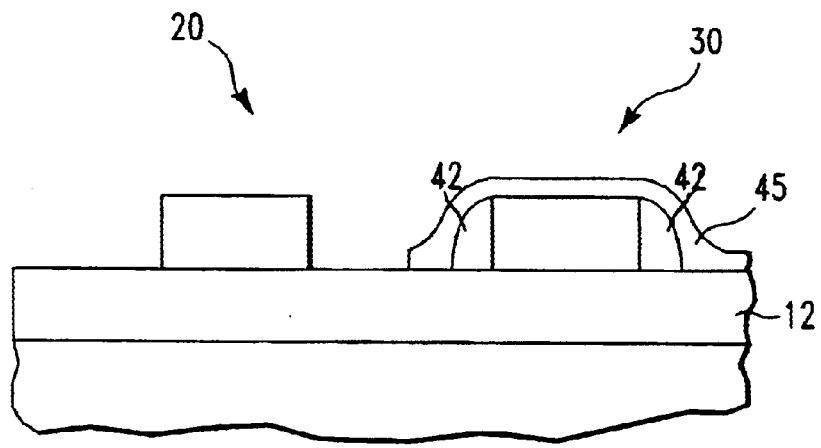

FIGS. 6A and 6B illustrate an alternative, preferred process for protecting the sidewall spacers 42 in the array portion 30 of the substrate when they are removed by selective etching in the logic portion 30 of the substrate. In this alternative process, a thin hardmask layer 45 of amorphous silicon or polysilicon is deposited over the oxide/spacer patterns 18, 42. A block mask 44, of mid-UV photoresist, for example, is then applied to the array portion 30. The hardmask 45 is then removed in the logic portion 20 by known techniques such as dry, directional etching or by wet etching while the block mask 44 protects the array portion 30. The hardmask 45 remains as a protective covering over the sidewall spacers 42 in the array portion 30. The block mask 44 is then removed by a resist strip process, as is known to those skilled in the art. Then, as illustrated in FIG. 6B, the sidewall spacers 42 are removed in the logic portion 20, such as via wet etch processes that are selective to silicon and oxide materials.

Figure 7:
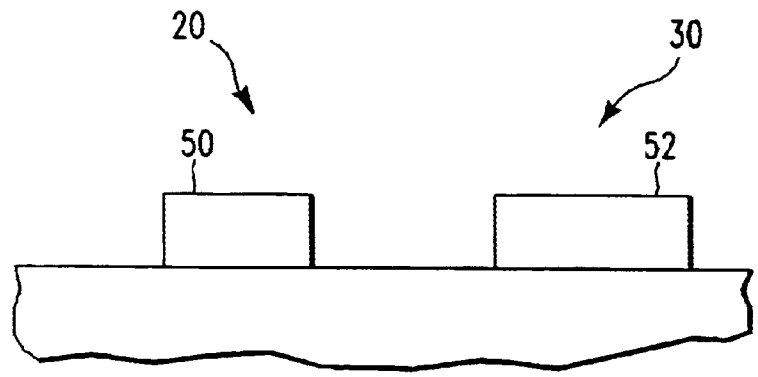

Next, as illustrated in FIG. 7, the polysilicon layer 12 is directionally etched, e.g. via reactive ion etch, using oxide patterns 18 as a hardmask in the logic portion 20, and oxide/spacer patterns 18, 42 as a hardmask in the array portion 30. The removal of the remaining polysilicon hardmask 45 in the array portion 30 occurs at the beginning of this directional polysilicon etch, as will be understood by those skilled in the art. Since the oxide/spacer patterns 18, 42 in the array portion 30 are larger, this results in the patterning of gate conductors 52 in the array portion 30 having longer gatelengths than the gate conductors 50 that are patterned in the logic portion 20. The remaining oxide patterns 18 and spacers 42 are then removed using standard wet strip processes that are selective to polysilicon and the gate dielectric material that are present.

Thus, by the foregoing process, gate conductors 50 having short gatelengths are formed in the logic portion 20 at the same time as gate conductors 52 having longatelengths are formed in the array portion 30, without requiring an additional critical dimension mask.

Further gate conductor processing, e.g. dopant implants, silicidation and/or metal deposition, array gate sidewall and cap isolation, etc. are then performed in the respective logic portion 20 and array portion 30, to complete the formation of gate conductors according to techniques which will be understood by those skilled in the art.

While the invention has been described herein in accordance with certain preferred embodiments thereof, those skilled in the art will recognize the many modifications and enhancements which can be made without departing from the true scope and spirit of the present invention, limited only by the claims appended below.

What is claimed is:

1. A method of simultaneously patterning features having a first width in a first portion of an integrated circuit, and having a second width in a second portion of an integrated circuit, comprising:

depositing a feature layer over a substrate;

depositing a hardmask material layer over said feature layer;

depositing and patterning a photoresist using a critical dimension mask to define photoresist patterns in both a first portion and a second portion of said substrate;

patterning said hardmask material layer with said photoresist patterns to form hardmask patterns in both said first portion and said second portion;

providing sidewall spacers on sidewalls of said hardmask patterns in said second portion; and simultaneously etching said feature layer in both said first portion and said second portion, using said hardmask patterns in said first portion to define features having a first width in said first portion, and using said hardmask patterns and said remaining sidewall spacers in said second portion to define features having a second, different width in said second portion.

2. The method of claim 1 wherein said first portion comprises a logic portion, and said second portion comprises an array portion.

3. The method of claim 2 wherein said first width is smaller than said second width.

4. The method of claim 1 wherein said a mask open process is performed to reduce a width of said hardmask patterns prior to forming said sidewall spacers.

5. The method of claim 4 in which said hardmask material layer comprises a deposited oxide.

6. The method of claim 5 wherein said hardmask material layer is deposited from a precursor of tetra-ethyl orthosilicate (TEOS).

7. The method of claim 5 in which said sidewall spacers are formed by depositing a nitride over said hardmask patterns in both said first portion and said second portion and then removing said sidewall spacers from said hardmask patterns in said first portion.

8. The method of claim 7 further comprising, before removing said sidewall spacers from said first portion, depositing a thin layer comprising a material of said feature layer, and removing said thin layer in said first portion, said thin layer serving to protect said sidewall spacers in said second portion from removal.

9. The method of claim 8 wherein said thin layer and said sidewall spacers in said second portion are protected by block mask during removal of said sidewall spacers from said first portion.

10. The method of claim 7 wherein said sidewall spacers in said second portion are protected by block mask during removal of said sidewall spacers from said first portion.

11. A front-end-of-line (FEOL) processing method of simultaneously patterning polysilicon features having a first linewidth in a first portion of an integrated circuit, and having a second linewidth in a second portion of an integrated circuit, comprising:

depositing a polysilicon layer over a substrate;

depositing a hardmask material layer over said polysilicon layer;

depositing and patterning a photoresist using a critical dimension mask to define photoresist patterns in both a first portion and a second portion of said substrate;

patterning said hardmask material layer with said photoresist patterns to form hardmask patterns in both said first portion and said second portion;

providing sidewall spacers on said hardmask patterns in said second portion; and simultaneously etching said polysilicon layer in both said first portion and said second portion, using said hardmask patterns in said first portion to define polysilicon features having a first linewidth in said first portion, and using said hardmask patterns and said sidewall spacers in said second portion to define polysilicon features having a second, different linewidth in said second portion.

12. The method of claim 11 wherein said first portion comprises a logic portion, and said second portion comprises an array portion.

13. The method of claim 12 wherein said first width is smaller than said second width.

14. The method of claim 13 wherein said a mask open process is performed to reduce a width of said hardmask patterns prior to forming said sidewall spacers.

15. The method of claim 14 in which said hardmask material layer comprises a deposited oxide.

16. The method of claim 15 in which said sidewall spacers are formed by depositing a nitride over said hardmask patterns in both said first portion and said second portion and removing said sidewall spacers from said hardmask patterns from said first portion.

17. The method of claim 16 further comprising, before removing said sidewall spacers from said first portion, depositing a thin layer comprising polysilicon, and removing said thin layer in said first portion, said thin layer serving to protect said sidewall spacers in said second portion from removal.

18. The method of claim 16 wherein said sidewall spacers in said second portion are protected by block mask during removal of said sidewall spacers from said first portion.

19. The method of claim 18 wherein said first portion comprises a logic portion and said second portion comprises an array portion and wherein said polysilicon features in said first portion comprise gate conductors.

20. The method of claim 19 wherein said polysilicon features in said second portion comprise wordlines.

* * * * *